United States Patent
Xie et al.

(10) Patent No.: US 9,412,695 B1
(45) Date of Patent: Aug. 9, 2016

(54) INTERCONNECT STRUCTURES AND METHODS OF FABRICATION

(71) Applicant: GLOBALFOUNDRIES Inc., Grand Cayman (KY)

(72) Inventors: Ruilong Xie, Schenectady, NY (US); Hiroaki Niimi, Cohoes, NY (US); Andreas Knorr, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/641,699

(22) Filed: Mar. 9, 2015

(51) Int. Cl.
*H01L 23/52* (2006.01)
*H01L 23/528* (2006.01)
*H01L 21/768* (2006.01)
*H01L 29/66* (2006.01)
*H01L 29/423* (2006.01)
*H01L 21/311* (2006.01)
*H01L 21/32* (2006.01)
*H01L 29/78* (2006.01)
*H01L 23/535* (2006.01)
*H01L 23/532* (2006.01)

(52) U.S. Cl.
CPC ........ *H01L 23/528* (2013.01); *H01L 21/31111* (2013.01); *H01L 21/32* (2013.01); *H01L 21/76816* (2013.01); *H01L 21/76831* (2013.01); *H01L 21/76895* (2013.01); *H01L 23/535* (2013.01); *H01L 23/53271* (2013.01); *H01L 29/42364* (2013.01); *H01L 29/66795* (2013.01); *H01L 29/7851* (2013.01)

(58) Field of Classification Search
CPC .......... H01L 2924/01078; H01L 2924/01079; H01L 2924/01029; H01L 23/5226; H01L 23/481
USPC ......................................................... 257/774
See application file for complete search history.

(56) References Cited

U.S. PATENT DOCUMENTS

2014/0367795 A1* 12/2014 Cai ..................... H01L 27/0886
257/392

* cited by examiner

*Primary Examiner* — Monica D Harrison
(74) *Attorney, Agent, or Firm* — Heslin Rothenberg Farley and Mesiti PC; Nicholas Mesiti

(57) ABSTRACT

Methods and interconnect structures for circuit structure transistors are provided. The methods include, for instance: providing one or more fins above a substrate, and an insulating material over the fin(s) and the substrate; providing barrier structures extending into the insulating material, the barrier structures being disposed along opposing sides of the fin(s); exposing a portion of the fin(s) and the barrier structures; and forming an interconnect structure extending over the fin(s), the barrier structures confining the interconnect structure to a defined dimension transverse to the fin(s). Exposing the portion of the fin(s) and barrier structures may include isotropically etching the insulating material with an etchant that selectively etches the insulating material without affecting a barrier material of the barrier structures.

20 Claims, 10 Drawing Sheets

INTERCONNECT STRUCTURES AND METHODS OF FABRICATION

FIELD OF THE INVENTION

The present invention relates to integrated circuits and to methods of manufacturing integrated circuits, and more particularly, to interconnect structures and methods of fabricating interconnect structures for, for example, transistors of an integrated circuit.

BACKGROUND OF THE INVENTION

Integrated circuit fabrication, such as semiconductor device fabrication, may include fabricating fin-type field-effect transistors (FinFETs), which may include interconnect structures connecting source/drain regions of fin structures to, for example, one or more metallization layers of the circuit structure. As transistors become smaller, circuit structure manufacturing flows may be altered and alternative process flows introduced to adapt existing fabrication tools to smaller circuit structure feature sizes.

BRIEF SUMMARY

Various shortcomings of the prior art are overcome, and additional advantages are provided through the provision, in one aspect, of a method which includes facilitating fabricating a circuit structure, the facilitating fabricating including: providing at least one fin above a substrate, and an insulating material over the at least one fin and the substrate; providing a first barrier structure and a second barrier structure extending into the insulating material, the first barrier structure and second barrier structure being disposed along opposing sides of the at least one fin; exposing at least a portion of the at least one fin and the first barrier structure and the second barrier structure; and forming an interconnect structure extending, at least in part, over the at least one fin, wherein the first and second barrier structures confine the interconnect structure to a defined dimension transverse to the at least one fin.

In another aspect, also provided is a structure which includes a circuit structure that includes: at least one fin above a substrate; a first barrier structure and a second barrier structure, the first barrier structure and the second barrier structure disposed along opposing sides of the at least one fin; and, an interconnect structure over the fin, the interconnect structure having a dimension transverse to the at least one fin confined by the first and second barrier structures.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
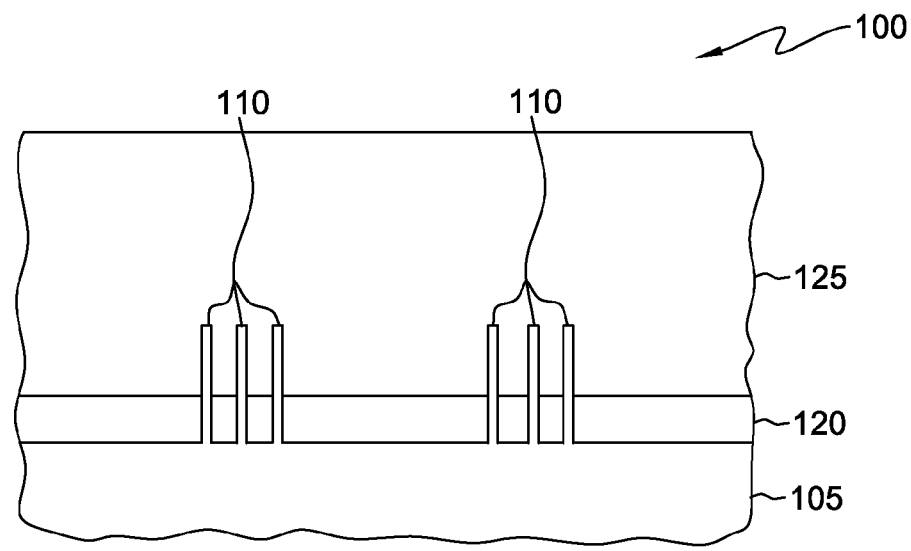
FIGS. 1A-1G depict one embodiment of a process for fabricating a circuit structure including forming first and second barrier structures and an interconnect structure over a fin, the barrier structures confining a defined dimension of the interconnect structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

As transistors become smaller, manufacturing processes frequently require modification to adapt existing fabrication tools and techniques to form smaller designs and feature sizes. One such modification, for example, includes formation of trench interconnect structures by, for instance, epitaxial material growth over fin structures early in the manufacturing flow, such as following formation of temporary gate structures over fin structures. Such techniques may be referred to as "early trench epitaxy" due to the early formation of interconnect structures within the trenches between gate structures, compared to methods that form trench silicide interconnect structures much later in a manufacturing flow. Early trench epitaxy may be desirable in many process flows because the epitaxial growth may greatly increase the size of the interconnect structures without compromising the design ground rules of the circuit structure or damaging replacement metal gate (RMG) stacks formed later in the manufacturing flow.

Early trench epitaxy may generally include first selectively opening the trenches between gate structures by removing dielectric material, usually an oxide-based compound, from between the gate structures. In order to ensure the epitaxial material is confined to the trench space over fin structures, an anisotropic etch process, such as a plasma reactive-ion etch (RIE) process, may be used to selectively remove the dielectric from over individual transistor structures while leaving the remaining dielectric (outside the transistor structures) in place to confine the growth of the epitaxy material. Plasma RIE techniques, for example, are often used for anisotropic etch processes in part because the plasma RIE etch may selectively remove oxide materials at a much faster rate than other compounds, such as nitride materials that may be disposed over gate structures as a spacer material.

However, even highly selective anisotropic etch techniques tend to cause etching damage to materials that should remain unetched. Plasma RIE techniques, for instance, may etch away portions of nitride spacers over gate structures, and may even etch portions of the underlying gate structure materials. Damage to temporary gate structures may lead to replacement gate structures being deformed and lacking uniform height or junction sizes. Damage to the spacers over gate structures may allow gate structures to come into electrical contact with interconnect structures, resulting in electrical shorts. If the interconnect structures are formed by epitaxy, some epitaxial material may grow on the exposed temporary gate structures, causing interference with subsequent gate processing and etching processes. There is thus a need for a process that allows for a more highly selective etching of trenches for interconnect structure formation and also allows for confinement of epitaxially grown interconnect structures in the trenches.

Thus, generally stated, disclosed herein is a method including facilitating fabricating a circuit structure, the facilitating fabricating including: providing at least one fin above a substrate, and an insulating material over the at least one fin and the substrate; providing a first barrier structure and a second barrier structure extending into the insulating material, the first barrier structure and second barrier structure being disposed along opposing sides of the at least one fin; exposing at least a portion of the at least one fin and the first barrier structure and the second barrier structure; and forming an interconnect structure extending, at least in part, over the at least one fin, wherein the first and second barrier structures confine the interconnect structure to a defined dimension transverse to the at least one fin. The first and second barrier structures may be a different material from the insulating material, and may facilitate an etching of the insulating material, such as by isotropic etching processes, that are highly selective to the insulating material without affecting the barrier structures.

Reference is made below to the drawings, which are not drawn to scale for ease of understanding, wherein the same reference numbers used throughout different figures designate the same or similar components.

FIGS. 1A-1F depict one embodiment of a process for facilitating fabrication of a circuit structure including providing a first and second barrier structure on opposing sides of at least one fin, and forming an interconnect structure that is confined by the first and second barrier structures. FIG. 1A depicts a cross-section of one embodiment of a structure 100 including a substrate 105 and at least one fin 110 above the substrate. An insulating material 125 is provided over the at least one fin 110 and substrate 105. Substrate 105 may be, for example, a silicon substrate such as a mono-crystalline or poly-crystalline wafer. The at least one fin 110 may be the same material as substrate 105, such as fins formed from substrate 105 in a bulk fin formation process, or may include additional or different materials than substrate 105. Insulating material 125 may be any electrically insulating material that may be selectively removed by an etching process without affecting barrier structures that extend into the insulating material, as further described herein. In exemplary embodiments, insulating material 125 may be an oxide material, such as silicon oxide or silicon dioxide. As depicted by FIG. 1A, structure 100 may also include an additional insulating material layer 120 over substrate 105. The material of additional insulating material layer 120 may be the same or similar material to insulating material 125, or may be a different material chosen so that an etching process, as described below, may selectively remove insulating material 125 without removing additional insulating material layer 120. In exemplary embodiments in which insulating material 125 and additional insulating material layer 120 include the same or similar materials, an etching process as described herein may be controlled so that additional insulating material layer 120 is left behind following the etching of insulating material 125. In embodiments in which additional insulating material layer 120 is a different material than insulating material 125, an etching process as described herein may etch insulating material 125 without etching the additional insulating material layer 120. In general, regardless of specific materials chosen for insulating material 125 and additional insulating material layer 120, in exemplary embodiments that include multiple fins, such as the fins 110 depicted in FIG. 1A, the fins may remain electrically isolated by additional insulating material layer 120 throughout subsequent processing and in the finished circuit structure.

Figure 1B:
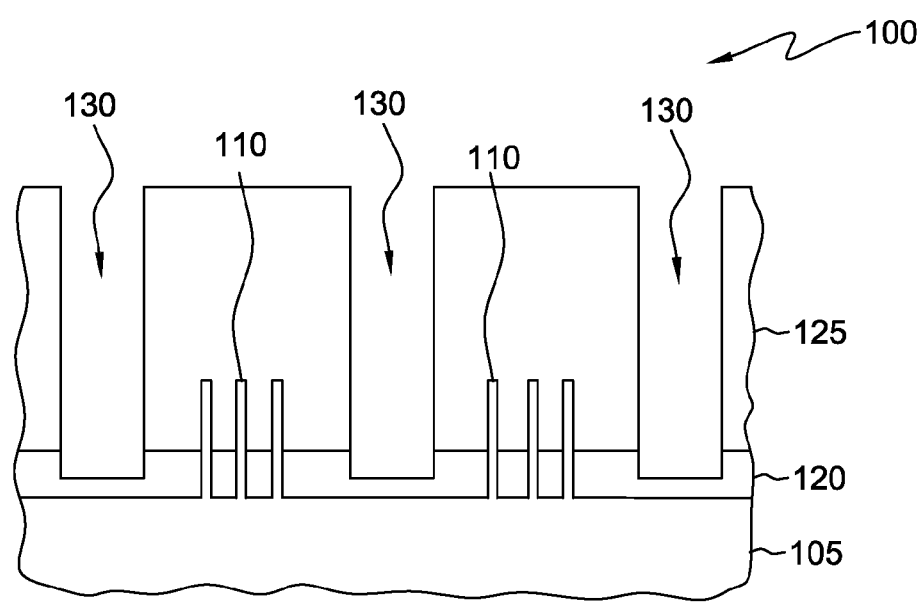

FIG. 1B depicts the structure 100 of FIG. 1A following provision of a first trench 130 and a second trench 130 extending into insulating material 125. First and second trenches 130 may be disposed on opposing sides of the at least one fin 110 along a length of the at least one fin 110. In exemplary embodiments in which a transistor structure includes a group of fins, first and second trenches 130 may be formed on opposing sides of the group of fins, as in the embodiment depicted in FIG. 1B. First and second trench 130 may be formed, for example, by providing a patterned masking layer (not depicted) over insulating material 125 and etching the first and second trench 130 according to the patterned masking layer. Etching first and second trench 130 may, for example, include an anisotropic etching process, such as reactive-ion etching, that selectively etches insulating material without significantly etching other circuit structure components, such as spacer material over a plurality of gate structures (as depicted in FIGS. 1F and 1G). As FIG. 1B depicts, first and second trenches 130 may extend into and through insulating layer 125, and may further extend into additional insulating material layer 120.

Figure 1C:
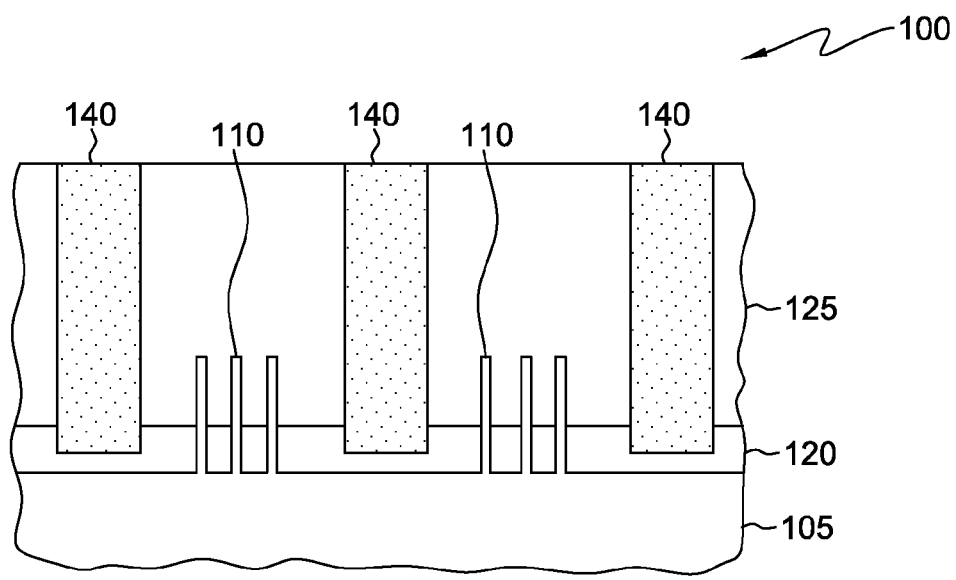

FIG. 1C depicts the structure 100 of FIG. 1B following provision of first a barrier structure 140 and a second barrier structure 140 extending into insulating material 125. First and second barrier structures 140 may be disposed on opposing sides of the at least one fin 110 along a length of the at least one fin 110. In exemplary embodiments in which a transistor structure includes a group of fins, first and second barrier structures 140 may be formed on opposing sides of the group of fins, as in the embodiment depicted in FIG. 1C. First and second barrier structures 140 may be formed by depositing a barrier material in first and second trenches 130 (as depicted in FIG. 1B). The barrier material of first and second barrier structures 140 may be a different material from insulating material 140 and may be selected to facilitate etching of the insulating material 125 without affecting first and second barrier structures 140. For instance, in exemplary embodiments in which insulating material 125 includes an oxide compound such as silicon oxide, the barrier material may be a nitride compound, such as silicon nitride. The barrier material of first and second barrier structures 140 may advantageously be the same nitride material as spacer material provided over a plurality of gate structures, as described further herein.

Figure 1D:
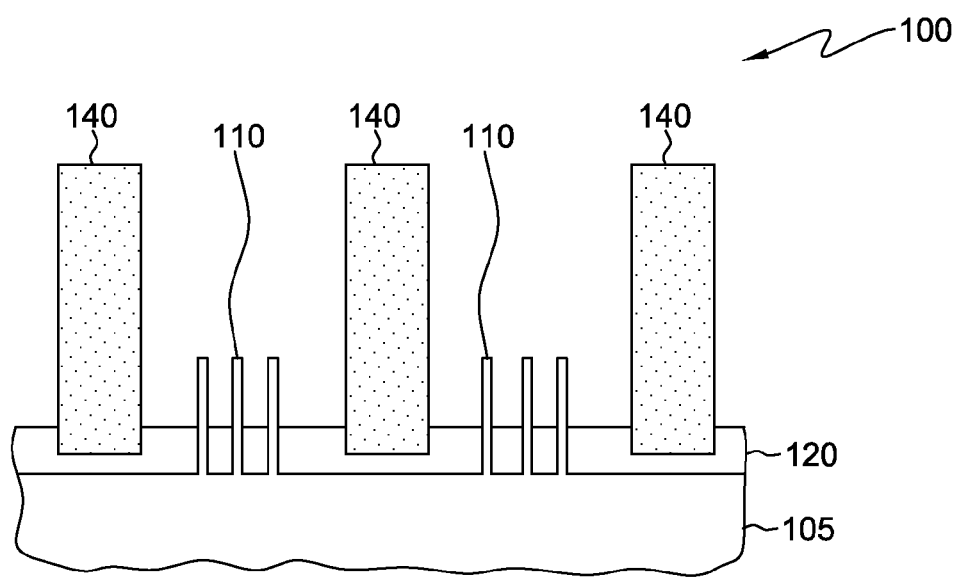

FIG. 1D depicts the structure 100 of FIG. 1C following exposing at least a portion of the at least one fin 110, along with exposure of first barrier structure 140 and second barrier structure 140. Exposing of at least a portion of the at least one fin 110 may include etching insulating material 125. The etching may be facilitated by insulating material 125 and the barrier material of first and second barrier structures 140 being different materials, so that the etching may remove insulating material 125 without affecting the first and second barrier structures 140. The etching may include isotropically etching insulating material 125 with an etchant selected to remove the insulating material without affecting the first and second barrier structures. In exemplary embodiments in which insulating material 125 includes an oxide compound and first and second barrier structures 140 include a nitride compound, the etchant may be, for instance, buffered hydrofluoric acid (BHF). Isotropic etchants such as buffered hydrofluoric acid may be more highly selective to etching oxide compounds than anisotropic etching processes such as plasma RIE processes. Isotropic etchants may thus successfully remove insulating material 125 with little or no etching damage to first and second barrier structures 140, as well as spacer materials over gate structures as described further below. The additional insulating material layer 120 may, as in the exemplary embodiment depicted in FIG. 1D, provide an "anchor" for first and second barrier structures 140 following removal of insulating material 125.

Figure 1E:
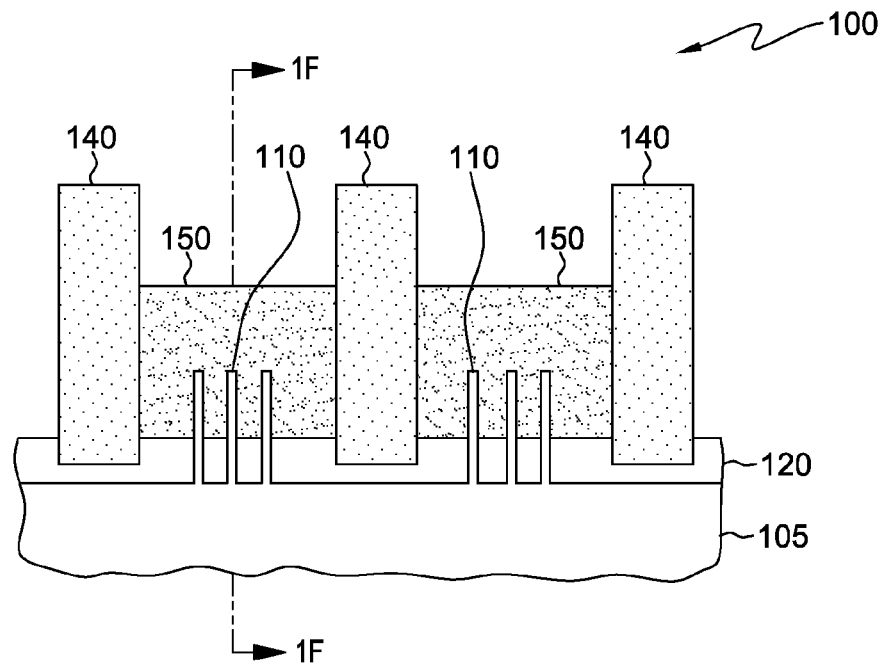
Figure 1F:
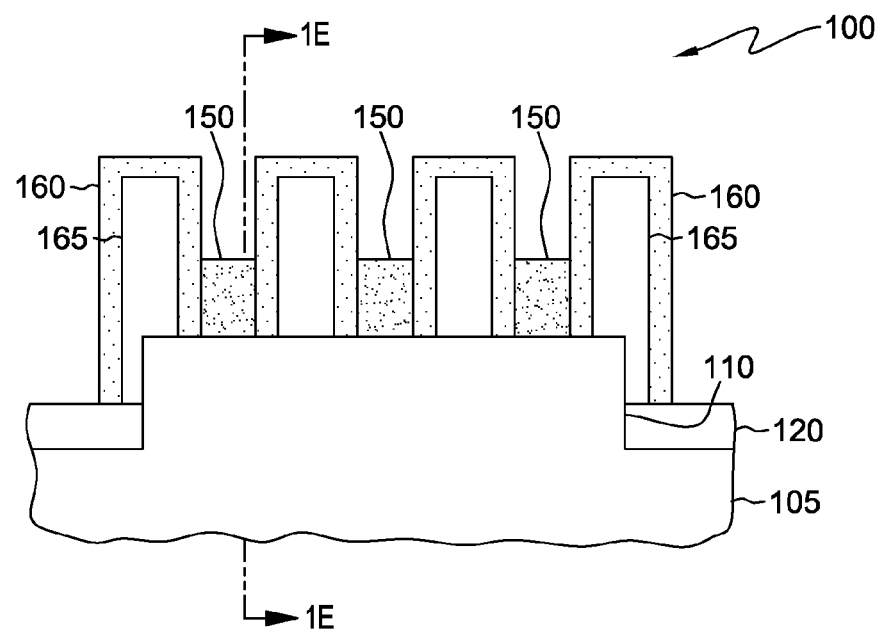
Figure 1G:
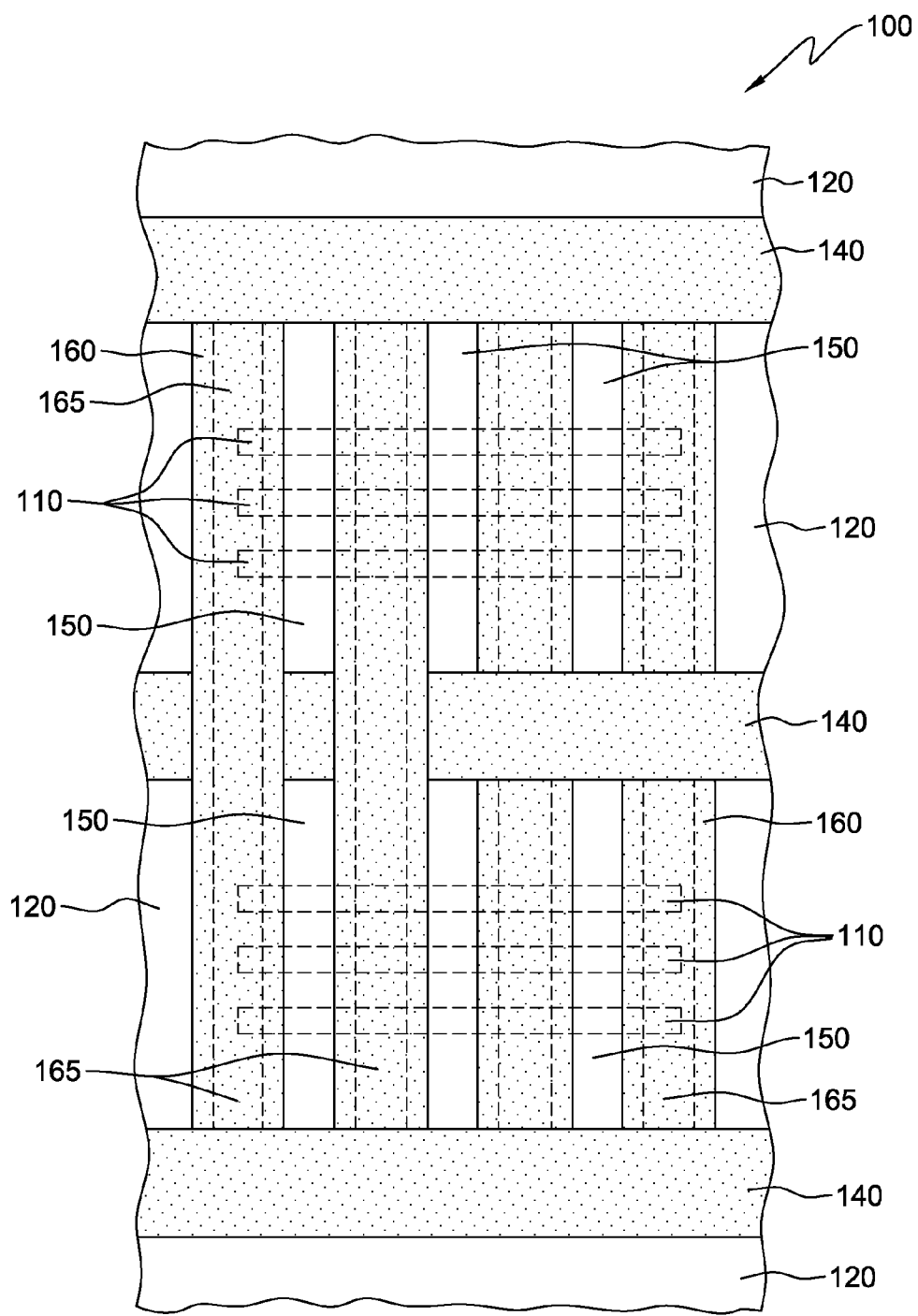

FIG. 1E depicts structure 100 of FIG. 1D following forming an interconnect structure 150. Interconnect structure 150 extends, at least in part, over the at least one fin 110 or a group of fins 110, and first and second barrier structures 140 confine the interconnect structure 150 to a defined dimension transverse to the at least one fin 110. Forming of interconnect structure 150 may include, in exemplary embodiments, epitaxially growing an interconnect material over the at least one fin, with the first and second barrier structures 140 acting to confine the epitaxial growth of the interconnect material. Due to the first and second barrier structures 140 confining the epitaxial growth process, the epitaxial growth process may advantageously be allowed to continue growing interconnect structure 150 to a selected thickness over the at least one fin 110 without risk of unwanted interconnect material growing uncontrolled over other portions of structure 100. Forming interconnect structure 150 to a selected thickness may, in one or more embodiments, allow for further processing of the interconnect structure 150 to increase its surface area and reduce resistance in the interconnect structure 150, as described further below. The interconnect material may, for example, include a doped semiconductor material such as doped silicon-germanium.

FIG. 1F is a cross-sectional view of structure 100 through at least one fin 110 of FIG. 1E, depicting a plurality of gate structures 165 formed over at least one fin 110. The plurality of gate structures 165 may be orthogonal to the at least one fin 110. Gate structures 165 may include a spacer material 160 on outer surfaces of the gate structures 165. Spacer material 160 may be different from the insulating material 125 of FIGS. 1A-1C, so as to facilitate selective removal of the insulating material 125 without affecting spacer material 160. In exemplary embodiments in which insulating material 125 includes an oxide compound, the barrier material of the first and second barrier structures 140 as well as spacer material 160 may include a nitride compound. The barrier material and spacer material 160 may, for example, both include silicon nitride. An isotropic etch process, such as the exemplary etch process described previously, may thus remove insulating material 125 without affecting first and second barrier structures 140 and without affecting spacer material 160, thereby preserving gate structures 165 and preventing electrical shorts between interconnect structure 150 and gate structures 165. Interconnect structure 150, in addition to being confined by first and second barrier structure 140 as in FIG. 1E, may also be confined by the plurality of gate structures 165 and spacer material 160 to have a pre-defined width. The pre-defined width may, in ideal embodiments, conform to a critical dimension or other design rule specification for structure 100.

FIG. 1G depicts a top-down view of structure 100 of FIGS. 1E and 1F. In one embodiment, the plurality of gate structures 165 may be orthogonal to the at least one fin 110. The plurality of gate structures 165, as well as spacer material 160, may be formed prior to provision of first and second trenches 130 and first and second barrier structures 140 in exemplary embodiments, or may alternatively be formed following the formation of first and second barrier structures 140. In exemplary embodiments in which the plurality of gate structure 165 and spacer material 160 are formed prior to etching of first and second trenches 130 in insulating material 125, the etching process may selectively etch insulating material 125 without significantly etching spacer material 160 or underlying gate material 165. For example, in embodiments in which insulating material 125 is an oxide compound and spacer material 160 is a nitride compound, an anisotropic reactive-ion etching (RIE) process may be highly selective to etching the oxide compound with little etching damage to spacer material 160. Thus, provision of first and second barrier structures 140 may allow for one or more gate structures 165 to extend over several fins 110 and through one or more of barrier structures 140, as depicted in FIG. 1G. In exemplary embodiments in which spacer material 160 and barrier material of first and second barrier structures 140 are both nitride compounds, the deposition of barrier material in first and second trenches 130 may further result in some portion of the barrier material covering a portion or portions of the plurality of gate structures 165 that may be inadvertently exposed following etching of first and second trenches 130. This may effectively repair damage to spacer material 160 resulting from the etching of first and second trenches 130.

Figure 2A:
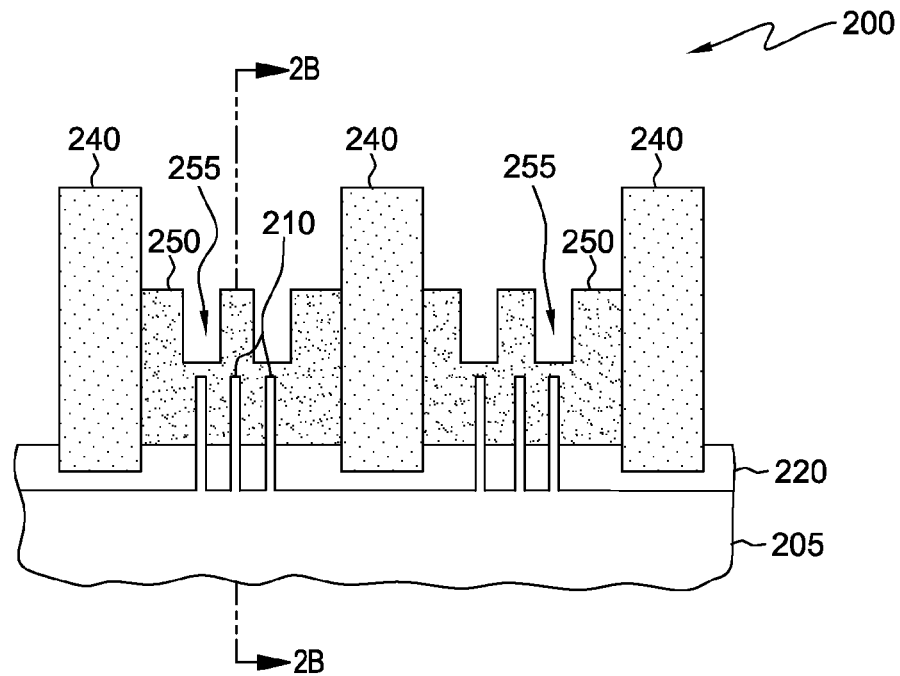
FIGS. 2A-2B depict one additional embodiment of the process depicted in FIGS. 1A-1G, in which trenches may be formed in the interconnect structure, in accordance with one or more aspects of the present invention; and, FIGS. 3A-3J depict one embodiment of an additional process for forming a metal contact over the interconnect structure depicted in FIGS. 1A-2B, with the metal contact confined by the barrier structures, in accordance with one or more aspects of the present invention.
Figure 2B:
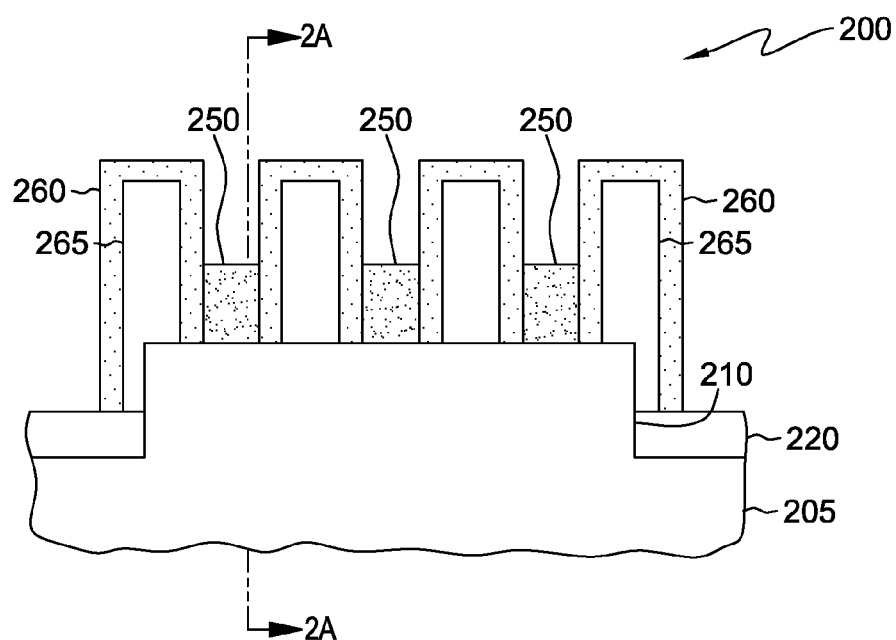

FIGS. 2A and 2B depict one embodiment of a structure 200, similar to the structure 100 depicted in FIGS. 1E-1G, following etching of one or more trenches 255 in the interconnect structure 250, the one or more trenches 255 increasing a surface area of an upper surface of interconnect structure 250 to facilitate reducing resistance in interconnect structure 250. The etching of trenches 255 may be facilitated or enabled by the epitaxial growth of interconnect structures 250 being confined by first and second barrier structures 240, as well as being confined by the plurality of gate structures 260, 265, as the confinement of the epitaxial growth may permit interconnect structure 250 to be grown to a sufficient thickness over at least one fin 210 without the epitaxy material undesirably spreading over other portions of the structure 200. In turn, a sufficient thickness of interconnect structure 250 may allow for etching of trenches 255 without inadvertently etching trenches 255 through the at least one fin 210 or other circuit structure features. It may be understood that the shape, depth, number of trenches 255 formed, and so on may vary in different embodiments, depending in part on design specifications for the final circuit structure. It may also be understood that etching trenches in interconnect structure 250 is optional, and in alternative embodiments there may be no trenches etched in interconnect structure 250.

Figure 3A:
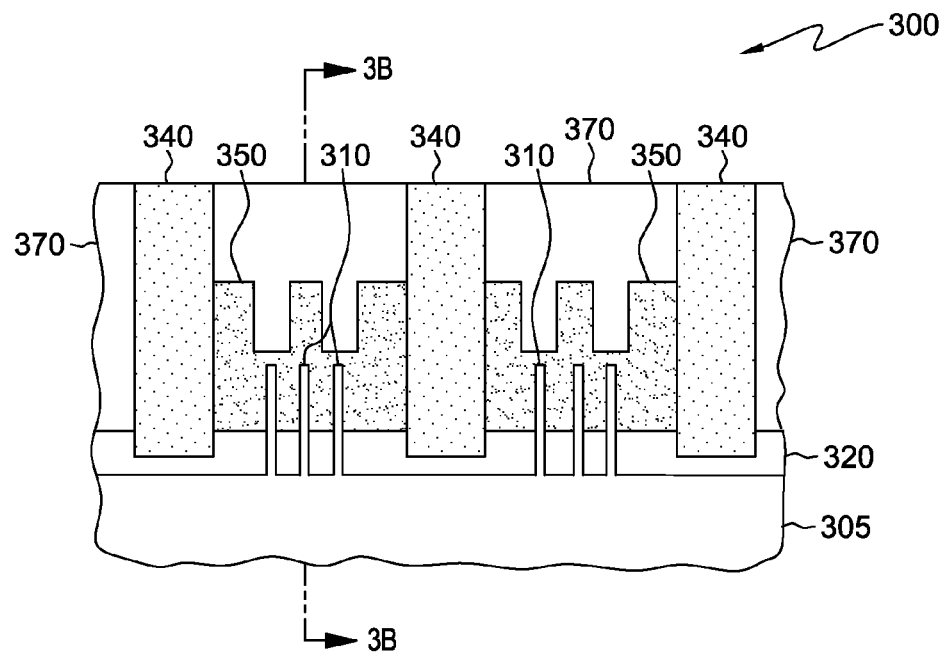
Figure 3B:
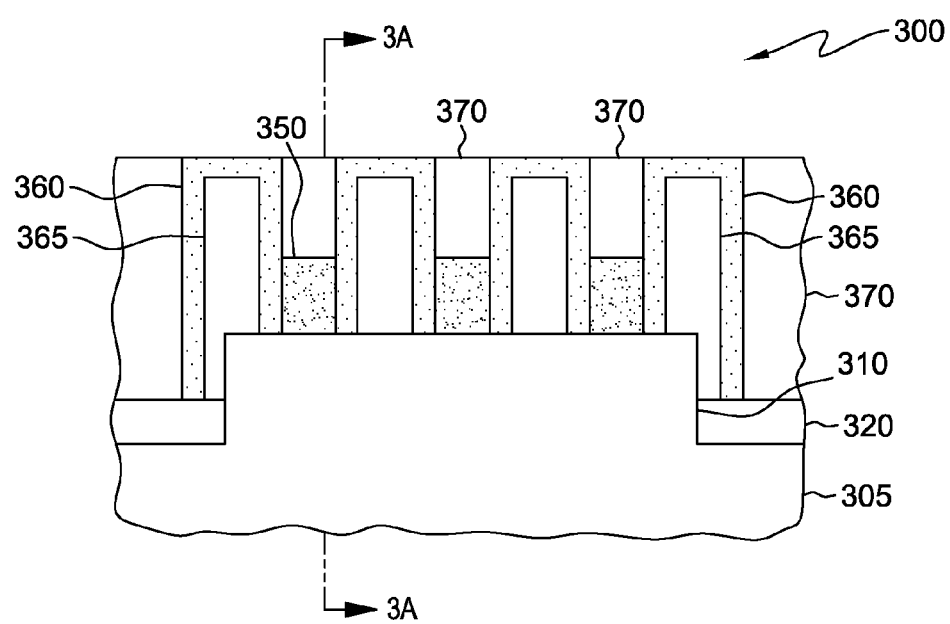

FIGS. 3A-3J depict one embodiment of additional processing of circuit structure 300, similar to structures 100 and 200 in FIGS. 1A-2B, for forming a metal contact over interconnect structure 350, in which the first and second barrier structures confine the metal contact to have the pre-defined dimension transverse to the length of the at least one fin 310. FIGS. 3A and 3B depict cross-sectional views of structure 300 following provision of a second insulating material 370 over the circuit structure 300, including over interconnect structure 350. The second insulating material 370 may also be provided over first and second barrier structures 340 initially, and may subsequently be recessed to be co-planar with upper surfaces of first and second barrier structures 340, as well as to be co-planar with spacer material 360 over the plurality of gate structures 365. The recessing may be performed, for example, by a chemical-mechanical polishing (CMP) process. Second insulating material 370 may, in exemplary embodiments, be an insulating material similar to the first insulating material 125 of FIGS. 1A-1C, for example an oxide compound such as silicon oxide or silicon dioxide.

Figure 3C:
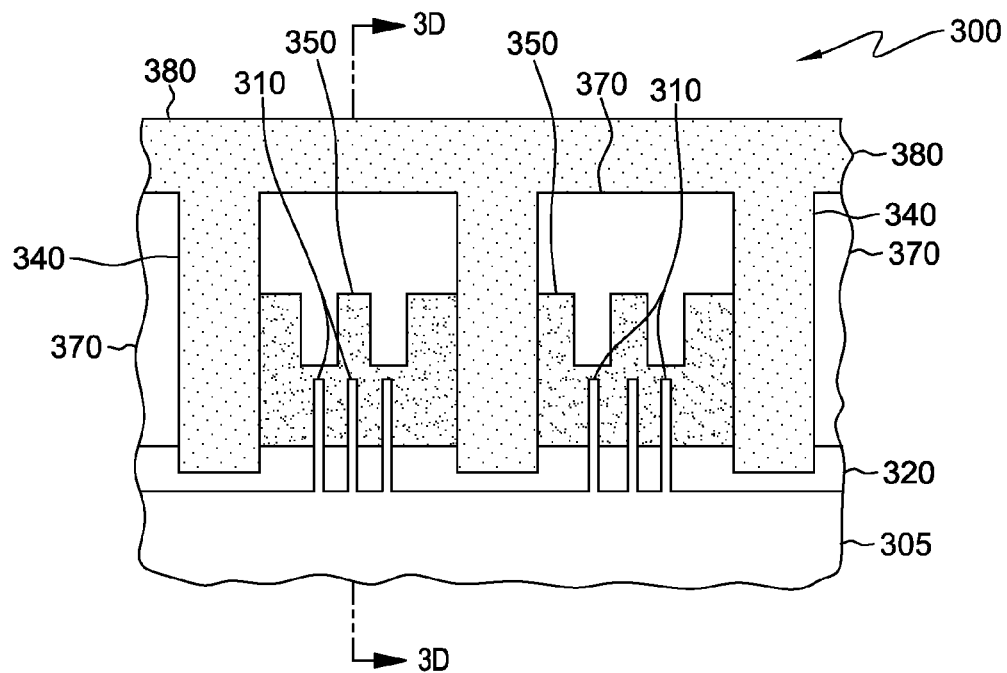
Figure 3D:
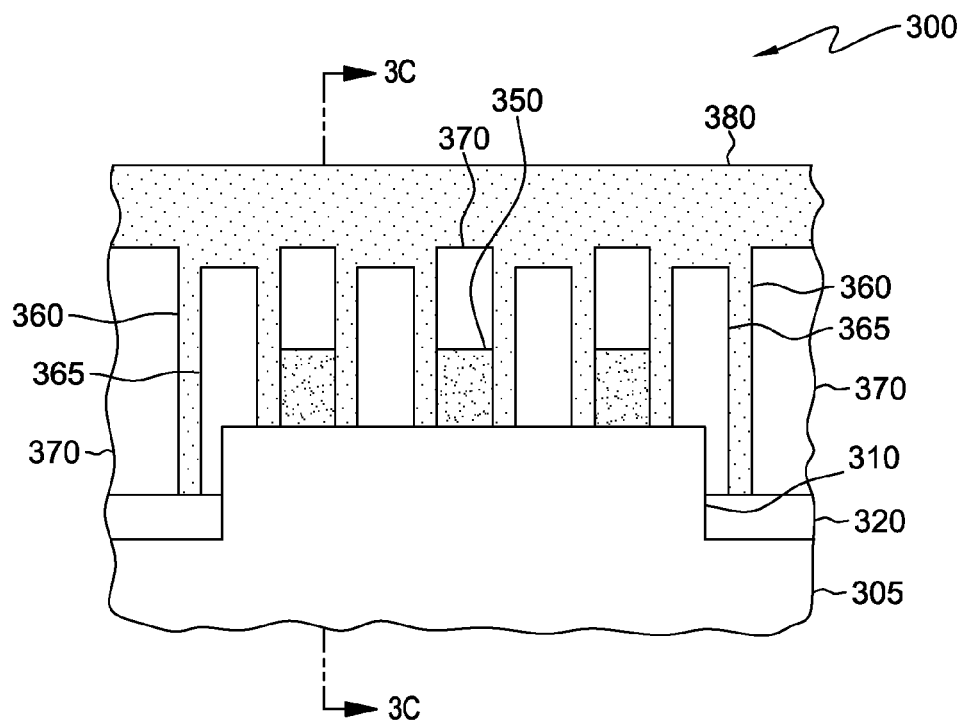

FIGS. 3C and 3D depict circuit structure 300 of FIGS. 3A and 3B following provision of a masking material 380 over second insulating material 370 and first and second barrier structures 340. Masking material 380 and second insulating material 370 may be different materials selected to allow, as described further below, selectively removing exposed portions of second insulating material 370 without affecting masking material 380. In exemplary embodiments where second insulating material 370 is an oxide compound, masking material 380 may be a nitride compound, such as silicon nitride. Masking material 380 may, in exemplary embodiments, be the same or similar nitride compound, such as silicon nitride, as the barrier material of first and second barrier structures 340. Masking material 380 may also be the same nitride compound as the nitride compound of spacer material 360 over the plurality of gate structures 365. Use of the same nitride compound for masking material 380 as spacer material 360 and barrier material of first and second barrier structures 340 may facilitate selectively etching second insulating material 370 from over interconnect structures 350, as described below.

Figure 3E:
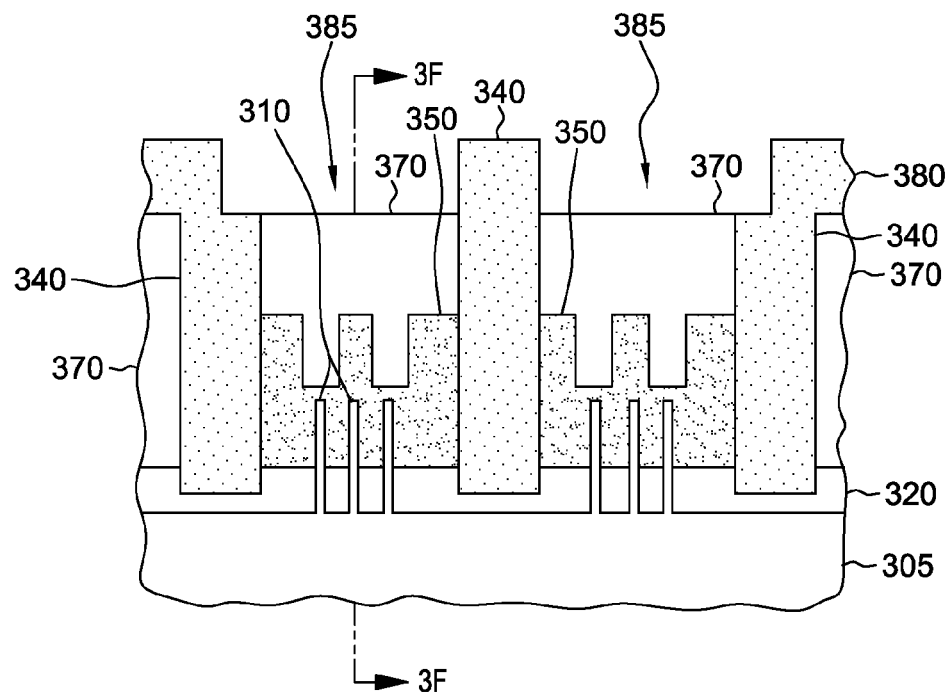
Figure 3F:
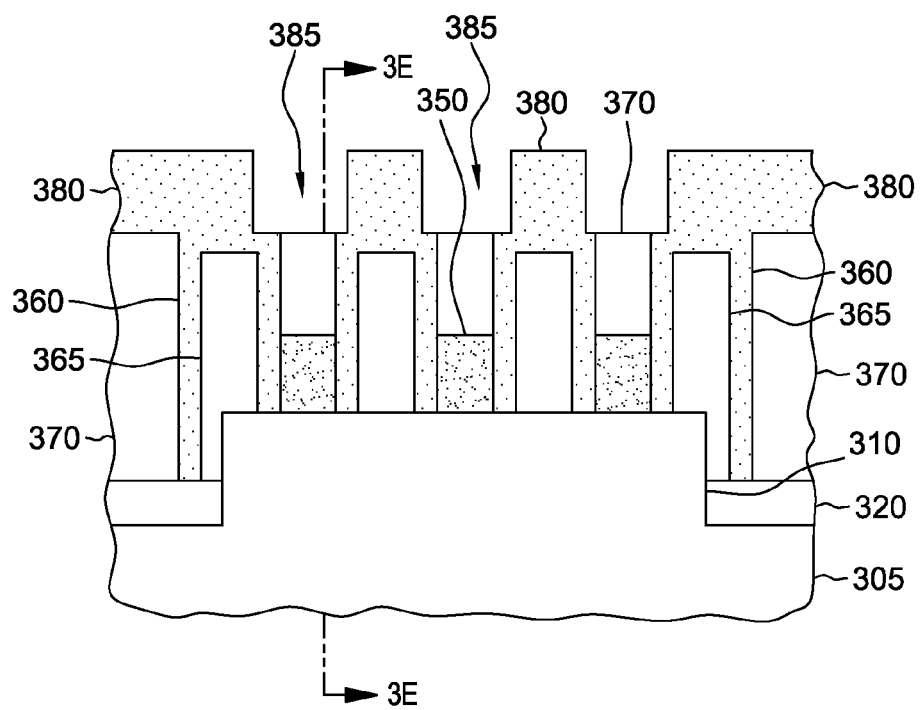

FIGS. 3E and 3F depict circuit structure 300 of FIGS. 3C and 3D following selectively etching a contact pattern 385 in masking material 380, such that the etching exposes 385 a portion of the second insulating material 370 over interconnect structure 350. Contact pattern 385 may be etched in masking material 380, for example, by a photo-lithographic patterning technique. Portions of masking material 380 that remain unetched may protect another portion of second insulating material 370 from subsequent processing and removal, as described below. The selectively etching may, in one example, include a timed etching process that is controlled to etch contact pattern 385 in masking material 380 until second insulating material 370 over interconnect structure 350 is exposed, and controlled so that the etching process does not inadvertently expose the plurality of gate structures 365.

Figure 3G:
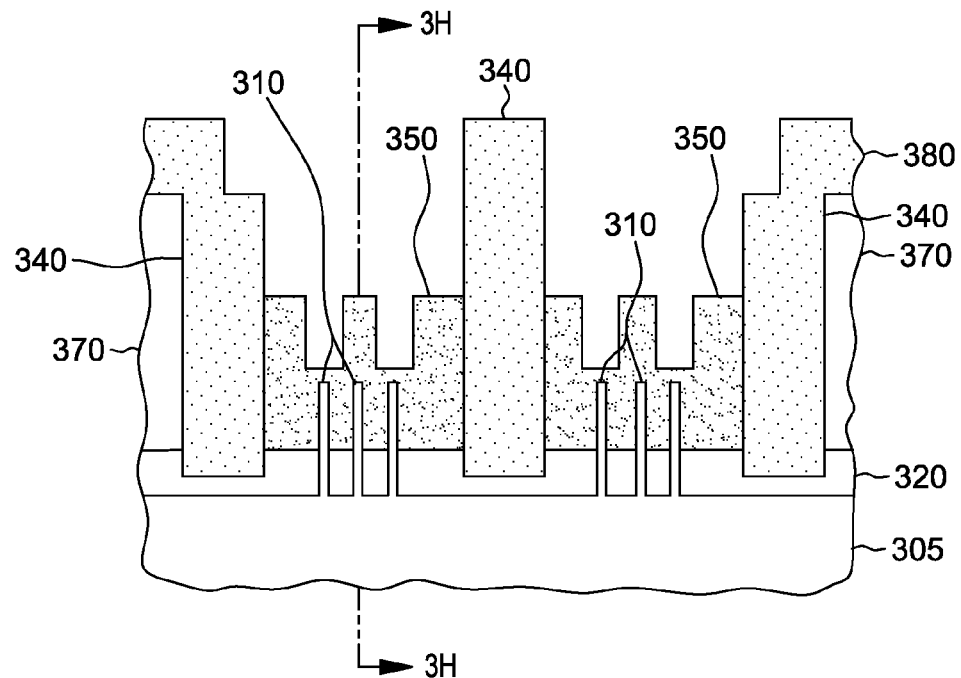
Figure 3H:
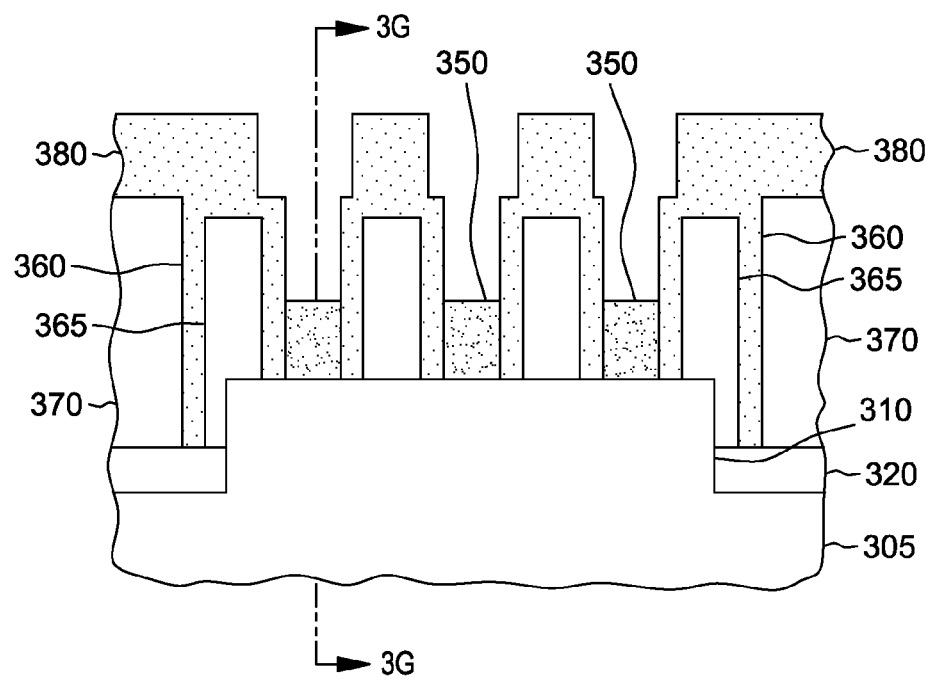

FIGS. 3G and 3H depict circuit structure 300 of FIGS. 3E and 3F following selective removal of the exposed portion of the second insulating material 370 from over interconnect structure 350. Selective removal of second insulating material 370 from over interconnect structure 350 may include etching second insulating material 370, for example by an isotropic etch process with an etchant that selectively removes second insulating material 370 without affecting first and second barrier structures 340, masking material 380, spacer material 360 over the plurality of gate structures 365, or interconnect structure 350. The etching may be facilitated by second insulating material 370 being a different material from the barrier material of first and second barrier structures 340, as well as masking material 380 and spacer material 360. In exemplary embodiments in which second insulating material 370 includes an oxide compound and first and second barrier structures 340, masking material 380, and spacer material 360 include a nitride compound, the etchant may be, for instance, buffered hydrofluoric acid (BHF) as described previously. Isotropic etchants such as BHF may also selectively etch oxide compounds without affecting the interconnect material of interconnect structure 350. For example, BHF may be highly selective to oxide compounds and may not affect doped semiconductor materials, such as doped silicon-germanium. Other portions of second insulating material 370 may be protected from the isotropic etching process by portions of masking material 380, as depicted in part by FIG. 3G.

Figure 3I:
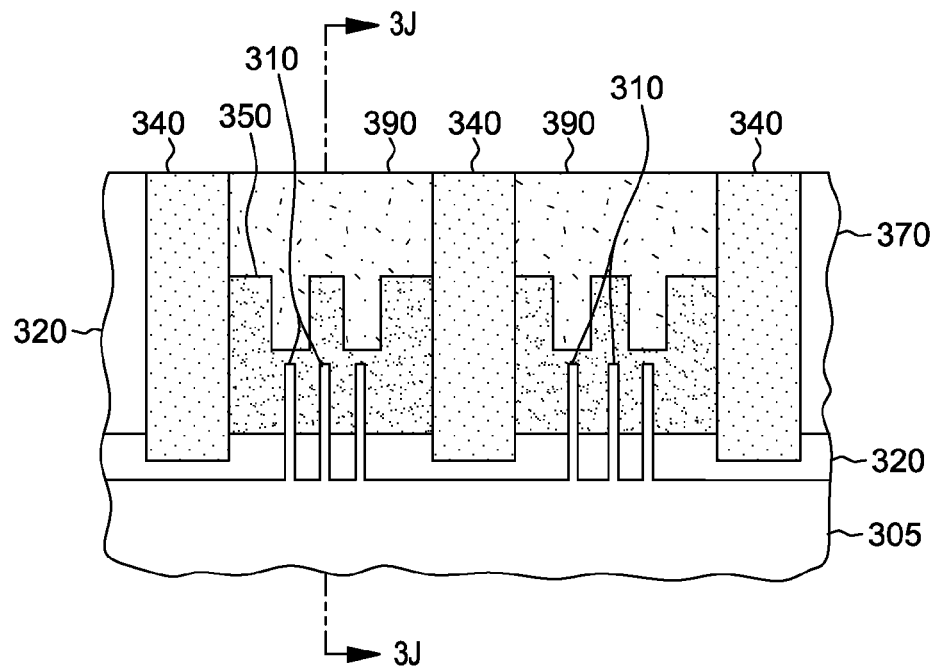
Figure 3J:
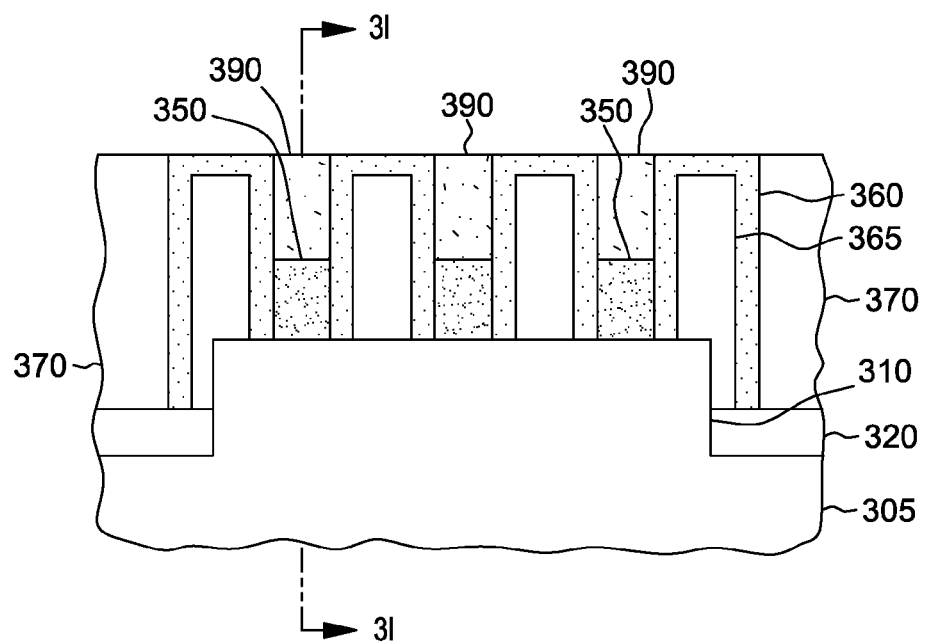

FIGS. 3I and 3J depict circuit structure 300 of FIGS. 3G and 3H following deposition of a contact material over interconnect structure 350 using the contact pattern in the masking material 380, forming metal contact 390 over interconnect material 350. FIGS. 3I and 3J also depict circuit structure 300 after masking material 380 has been removed. In exemplary embodiments, the contact material may be deposited over interconnect structure while masking material 380 is in place to ensure that the contact material is selectively deposited over interconnect structures 350. After the contact material has been deposited, masking material 380 may be removed and metal contacts 390 planarized to be co-planar with spacer material 360 and first and second barrier structures 340 by, for instance, a chemical-mechanical polishing (CMP) process. The CMP process may be controlled to stop when masking material 380 is removed and the remaining second insulating material 370 is exposed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   facilitating fabricating a circuit structure, the facilitating fabricating comprising:
      providing at least one fin above a substrate, and an insulating material over the at least one fin and the substrate;
      providing a first barrier structure and a second barrier structure extending into the insulating material, the first and second barrier structures being disposed along opposing sides of the at least one fin;

exposing at least a portion of the at least one fin and the first barrier structure and the second barrier structure; and forming an interconnect structure extending, at least in part, over the at least one fin, wherein the first and second barrier structures confine the interconnect structure to a defined dimension transverse to the at least one fin.

2. The method of claim 1, wherein providing the first barrier structure and the second barrier structure comprises:

providing a first trench and a second trench extending into the insulating material, the first trench and the second trench being disposed on opposing sides of the fin along a length of the at least one fin; and, depositing a barrier material in the first trench and the second trench to form the first and second barrier structures.

3. The method of claim 2, wherein the exposing comprises etching the insulating material, and wherein the insulating material and the barrier material are different materials selected to facilitate etching the insulating material without affecting the first barrier structure and the second barrier structure.

4. The method of claim 3, wherein the insulating material comprises an oxide compound and the barrier material comprises a nitride compound.

5. The method of claim 4, wherein the etching comprises isotropically etching the insulating material with an etchant selected to remove the insulating material without affecting the first and second barrier structures.

6. The method of claim 5, wherein the etchant comprises buffered hydrofluoric acid (BHF).

7. The method of claim 1, wherein forming the interconnect structure comprises epitaxially growing an interconnect material over the at least one fin, the epitaxially growing being constrained by the first and second barrier structures.

8. The method of claim 7, wherein the interconnect material comprises a doped semiconductor material.

9. The method of claim 1, further comprising etching one or more trenches in the interconnect structure, the one or more trenches increasing a surface area of an upper surface of the interconnect structure to facilitate reducing resistance in the interconnect structure.

10. The method of claim 1, further comprising forming a plurality of gate structures over the at least one fin, the plurality of gate structures being orthogonal to the at least one fin, and the plurality of gate structures comprising a spacer material on outer surfaces of the gate structures, the spacer material being different from the insulating material to facilitate selectively removing the insulating material without affecting the spacer material.

11. The method of claim 10, wherein the spacer material and a barrier material of the first and second barrier structures comprise a nitride compound.

12. The method of claim 10, wherein the interconnect structure is further confined by the plurality of gate structures to have a pre-defined width.

13. The method of claim 1, further comprising forming a metal contact over the interconnect structure, wherein the first and second barrier structures confine the metal contact to have the defined dimension transverse to the fin.

14. The method of claim 13, wherein the insulating material is a first insulating material, and wherein forming the metal contact comprises:

providing a second insulating material over the circuit structure;

providing a masking material over the second insulating material and the first and second barrier structures;

selectively etching a contact pattern in the masking material, the selectively etching exposing a portion of the second insulating material over the interconnect structure;

selectively removing the exposed portion of the second insulating material from over the interconnect structure; and depositing a contact material over the interconnect structure using the contact pattern in the masking material, the contact material forming the metal contact.

15. The method of claim 14, wherein the masking material and the second insulating material are different materials selected to facilitate selectively removing the exposed portion of the second insulating material without affecting the masking material.

16. The method of claim 15, wherein the masking material and a barrier material of the first and second barrier structures comprise a nitride compound.

17. The method of claim 15, wherein the second insulating material comprises an oxide compound, and wherein selectively removing the exposed portion of the second insulating material comprises isotropically etching the second insulating material with an etchant selected to remove the second insulating material without affecting the first and second barrier structures, the masking material, and the interconnect structure.

18. The method of claim 17, wherein the etchant comprises buffered hydrofluoric acid (BHF).

19. A structure comprising:

a circuit structure, the circuit structure comprising:

at least one fin above a substrate;

a first barrier structure and a second barrier structure, the first barrier structure and the second barrier structure disposed along opposing sides of the at least one fin; and an interconnect structure over the fin, the interconnect structure having a dimension transverse to the at least one fin confined by the first and second barrier structures.

20. The structure of claim 19, further comprising a metal contact over the interconnect structure, the metal contact having the dimension transverse to the at least one fin confined by the first and second barrier structures.

* * * * *